United States Patent
Iacoponi

(10) Patent No.: US 6,232,230 B1
(45) Date of Patent: May 15, 2001

(54) SEMICONDUCTOR INTERCONNECT INTERFACE PROCESSING BY HIGH TEMPERATURE DEPOSITION

(75) Inventor: John A. Iacoponi, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/227,067

(22) Filed: Jan. 5, 1999

(51) Int. Cl.[7] .................................................. H01L 21/44
(52) U.S. Cl. .............................................. 438/687; 438/687
(58) Field of Search ..................................... 438/619, 624, 438/627, 637, 638, 639, 640, 678, 687, 688, 660, 692, 626, 628, 633, 693, 697, 748, 653

(56) References Cited

U.S. PATENT DOCUMENTS

| | | | |
|---|---|---|---|
| 5,610,099 | * 3/1997 | Stevens | 437/192 |
| 5,713,774 | * 2/1998 | Thomas | 445/23 |
| 5,821,168 | * 10/1998 | Jain | 438/692 |
| 5,880,018 | * 3/1999 | Boeck et al. | 438/619 |
| 5,990,011 | * 11/1999 | Mcteer | 438/692 |
| 6,037,257 | * 3/2000 | Chiang et al. | 438/687 |
| 6,046,108 | * 4/2000 | Liu | 438/687 |

* cited by examiner

*Primary Examiner*—David Nelms
*Assistant Examiner*—David Nhu
(74) *Attorney, Agent, or Firm*—Mikio Ishimaru

(57) ABSTRACT

A method is provided for forming adhesion/barrier/conductor layers on semiconductor wafers in vias by using a high temperature adhesion/barrier material deposition step. The adhesion/barrier material is deposited over a channel conductor in the semiconductor dielectric with the semiconductor wafer at high temperature over 400° C., the temperature is reduced below 150° C., and then seed material is deposited so it is not exposed to temperatures above 150° C. which cause agglomeration.

14 Claims, 2 Drawing Sheets

SEMICONDUCTOR INTERCONNECT INTERFACE PROCESSING BY HIGH TEMPERATURE DEPOSITION

TECHNICAL FIELD

The present invention relates generally to semiconductors and more specifically to processing conductive/adhesion/barrier/seed materials used in semiconductors.

BACKGROUND ART

In the process of manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings.

Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that adhesion/barrier layers are required. Materials such as tantalum (Ta), titanium (Ti), and tungsten (W), their alloys, their nitrides, or combinations thereof are used as adhesion/barrier materials for copper. The adhesion/barrier layers server several different roles. First, they promote greater adhesion of the copper to the oxide layer. Second, they prevent diffusion of copper into the dielectric layer. And, third, they improve the resistance of copper to electromigration, which is the movement of copper atoms under the influence of current flow, which can cause voids in the copper.

The adhesion/barrier layer improves the resistance to electromigration in two areas. First, along the length of a conductive channel in the direction of current flow where the adhesion/barrier layer will be on three sides of the copper and the good interface reduces copper surface electromigration. And, second, in the contact area of a via with the conductive channel where the current density is higher than in the conductive channel itself.

A problem, associated with the interface between the adhesion/barrier layer of the via and the copper layer in the conductive channel below the via, is the difficulty bonding the two layers. For example, to provide the excellent bonding of the two layers by intermixing, the two layers must be annealed, or heated above about 400° C. Unfortunately, copper tends to clump, or agglomerate at temperatures above 150° C. which means that the optimal bonding temperatures can not be used.

The copper seed layers for copper interconnect in a damascene process are typically deposited by physical vapor deposition (PVD) or derivatives of PVD techniques on top of the adhesion/barrier materials. The preferred method of deposition is by low temperature physical vapor deposition, at temperatures below 100° C. or even 50° C., specifically because of the agglomeration problem.

Another problem, associated with the interface between the adhesion/barrier layer of the via and the copper layer, is contamination between the two layers. If there were any contamination, this would lead to high contact resistance. Again high temperature intermixing would assure a good interface and result in lower contact resistance.

A solution, which would permit the formation of an intermixed layer between the via and its contacted channel has been long sought, but has eluded those skilled in the art. As the semiconductor industry is moving from aluminum to copper and other type of materials with greater electrical conductivity and thinner channels and narrower vias, it is becoming more pressing that a solution is found.

DISCLOSURE OF THE INVENTION

The present invention provides a method for forming conductor/barrier layers on semiconductor channels and in vias by using a high temperature adhesion/barrier material deposition step. The adhesion/barrier material is deposited in a via over a channel conductor in the semiconductor dielectric at high temperature, the temperature is reduced, and then the seed material is deposited so it is not exposed to temperatures which would cause agglomeration.

The present invention provides a method for forming tantalum/copper barrier/conductor layers on semiconductor channels or in vias by using a high temperature tantalum deposition step. The semiconductor wafer is heated during the deposition so the tantalum and the copper channel material intermix, the wafer is cooled and the copper seed deposited at temperatures which do not cause agglomeration of the copper.

The present invention still further provides a method for forming an intermix region between barrier/conductor layers between about 50 and 100 angstroms in thickness.

The present invention still further provides a method for forming barrier/conductor layers on semiconductor channels and in vias with improved adhesion and diffusion suppression.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
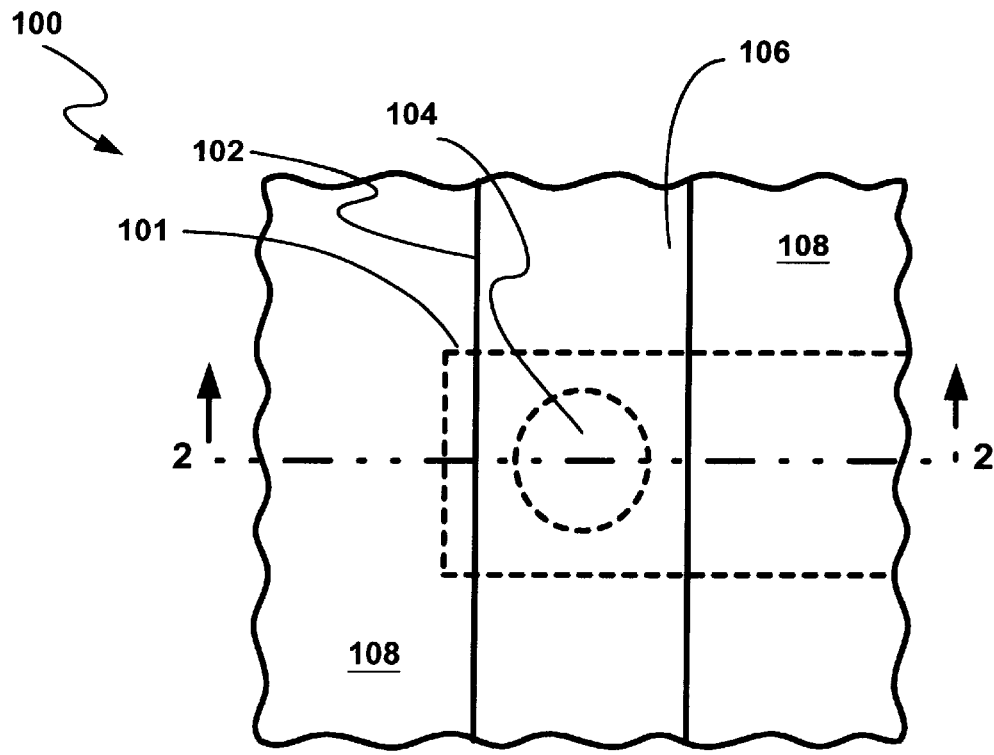
FIG. 1 (PRIOR ART) is a plan view of aligned channels with a prior art via.

Referring now to FIG. 1 (PRIOR ART), therein is shown a plan view of a prior art pair of perpendicularly aligned semiconductor channels of a conductive material such as aluminum or copper disposed on a production semiconductor wafer 100. A first channel 101 is shown disposed below a second channel 102 which extends substantially perpendicular to the first channel 101 in the plan view. A round via 104 connects the first and second channels 101 and 102 and is a part of the second channel 102 by being deposited by a dual damascene technique. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 2:
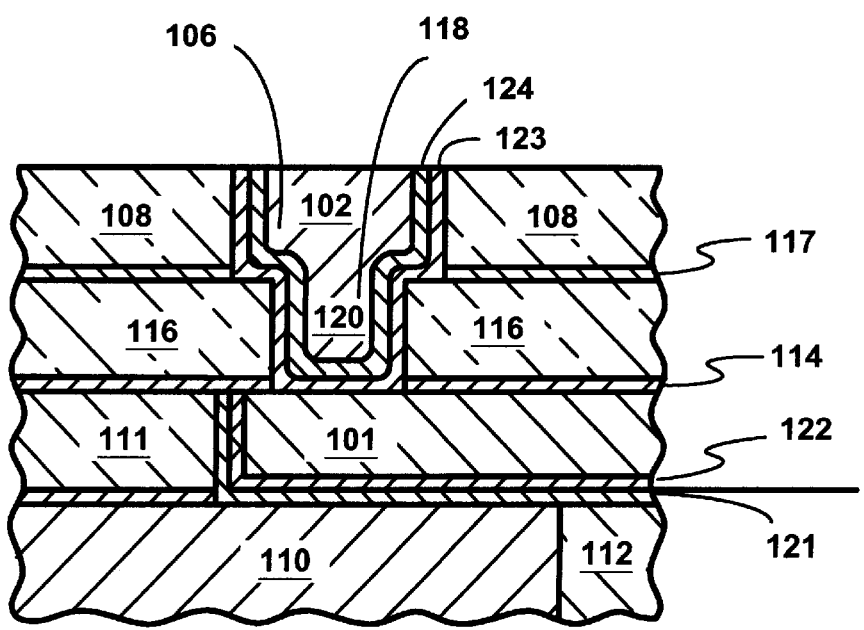
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 101 is disposed in a dielectric 111 over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1 (PRIOR ART) defines a cylindrical via 120 when it is filled with the second conductive material.

Also shown disposed around the first channel 101 are an adhesion/barrier layer 121 and seed layer 122, and around the second channel 102 and the cylindrical via 120 is a adhesion/barrier layer 123 and seed layer 124. The adhesion/barrier layer 123, for copper seed layers and copper or copper alloy conductive materials, is made up of adhesion/barrier materials such as tantalum, titanium, tungsten, their alloys, compounds thereof (especially nitrides) and combinations thereof. While the present invention uses a single adhesion/barrier layer, it should be understood that layers of different combinations of adhesion, barrier, and adhesion materials are also encompassed.

Figure 3:
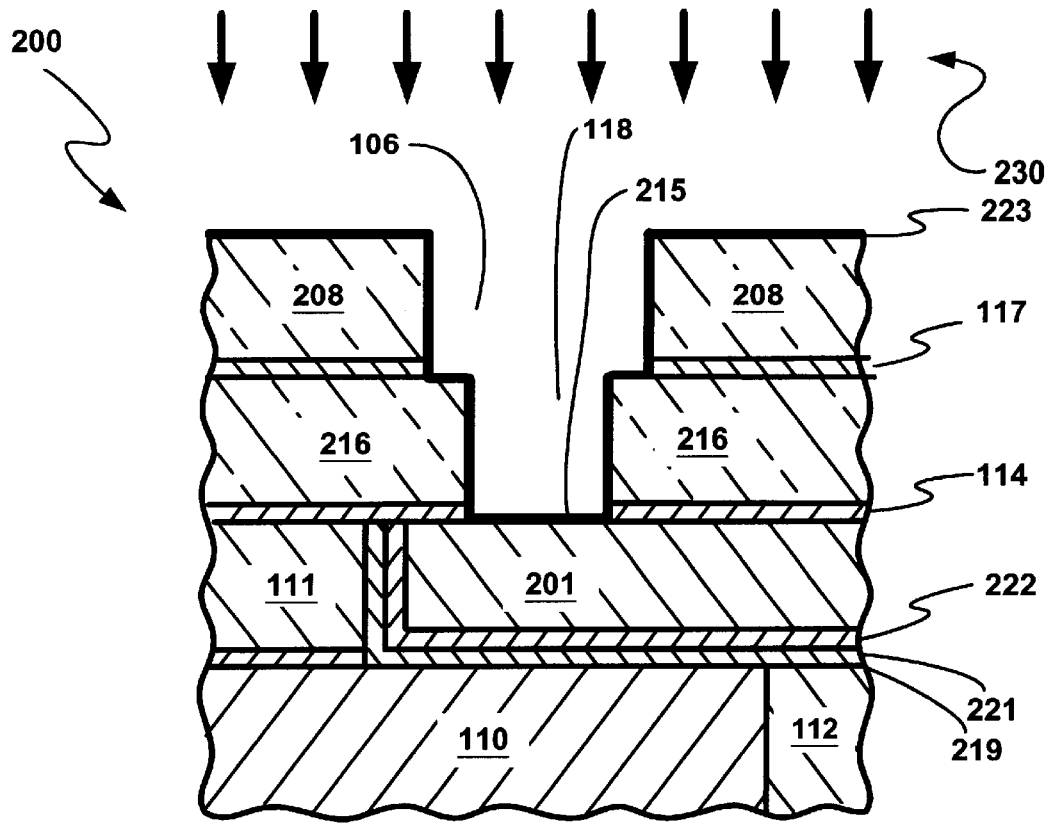
FIG. 3 is a simplified cross-section of a semiconductor wafer during the deposition of barrier material.

Referring to FIG. 3, therein is shown a cross-section of a semiconductor wafer 200 with a pair of perpendicularly aligned semiconductor channels, disposed over the silicon substrate 110 formed in accordance with the present invention. For convenience of illustration, like reference numerals are used in FIG. 3 to denote like elements already described in FIG. 1 (PRIOR ART) and FIG. 2 (PRIOR ART). A first channel 201 of copper is disposed over an adhesion/barrier layer 221 and a seed layer 222.

An adhesion/barrier layer 223 of lines a second channel opening 202 and a via opening 220. Lining the adhesion/barrier layer 223 is a seed layer 224. The semiconductor wafer 200 is heated to a high temperature while the adhesion/barrier material is being deposited as shown by the arrows 230. During the high temperature deposition, an intermix region 215 is formed of the adhesion/barrier material and the conductive layer material.

Figure 4:
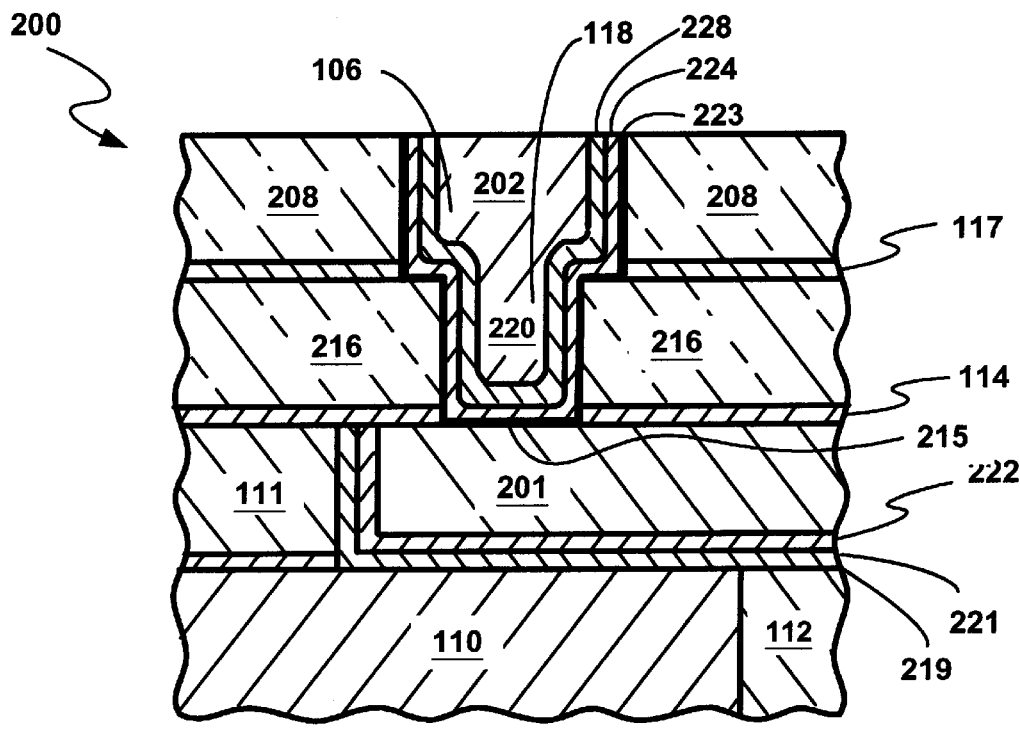
FIG. 4 is a simplified cross-section of the semiconductor wafer after chemical-mechanical polishing down to the dielectric layer.

Referring now to FIG. 4, therein is shown the cross-section of the semiconductor wafer 200 after filling of the second channel opening 202 and the via opening 220 with conductive material, and chemical-mechanical polishing (CMP). The CMP brings the adhesion/barrier layer 223, the seed layer 224, and the conductive material in the second channel opening 202 down to the level of the second channel oxide layer 108.

In production, a conventional first damascene process is used to dispose a first channel 201 in a first channel oxide layer (not shown) above portions of a semiconductor device (not shown) on a production semiconductor wafer 200. The damascene process is a photolithographic process which uses a mask to define a first channel opening (not shown) in the first channel oxide layer. The first channel opening is then filled with an adhesion/barrier layer and a seed layer. A first conductive material, such as copper or a copper alloy, is deposited using conventional metal deposition techniques, such as physical vapor deposition, chemical vapor deposition, electroplating, or a combination thereof, to form the first channel 201. The stop nitride layer 114, the via oxide layer 116, and the via nitride layer 117 would be successively deposited on top of the first channel 201 and the first channel dielectric layer 111 using conventional deposition techniques.

By using the via photoresist and the via photolithographic process followed by nitride etching of the round via 104 in the via nitride layer 117, the basis for the cylindrical via 118 is formed. The subsequent deposition of the second channel oxide layer 108 prepared the way for the second channel 106 to be perpendicular to the first channel 201.

The second damascene process uses a further mask to define the second channel opening 106 in the second channel oxide layer 108. Since the second damascene process uses an anisotropic oxide etch, the etch also forms the cylindrical via 118 down to the stop nitride layer 114. The anisotropic oxide etch etches faster in the vertical direction of FIG. 3 than in the horizontal direction. The nitride etch of the stop nitride layer 114 exposes a portion of the first channel 201 and completes the etching steps.

Next, the semiconductor wafer 200 is heated to a high temperature at which the adhesion/barrier and conductor materials will intermix and the deposition of the adhesion/barrier material started. For a conductive layer 220 of copper or copper alloy and an adhesion/barrier layer 224 of tantalum, the temperature will be at or above 400° C. The semiconductor wafer 200 can be heated to above 450° C. to even 500° C. for the short duration of the tantalum deposition. The maximum temperature will be dictated by the thermal budget of the semiconductor devices on the semiconductor wafer 200. This forms a very thin adhesion/barrier layer 223 which mixes with the copper in the conductive layer 201 to form the intermix region 215 of about 50 to 100 angstroms in thickness.

It should be noted that, in addition to heating the semiconductor wafer 200, high temperature deposition techniques such as ion metal plasma, collimated physical vapor deposition, other physical vapor deposition, chemical vapor deposition, and other processes may be used to for the intermix region 215, which is also the contact area between the via and the first channel.

The deposition continues until the complete adhesion/barrier layer 224 is deposited to line the second channel opening 106 and the cylindrical via 118, including along the walls of the second channel opening 106 and the cylindrical via 118.

Thereafter, the semiconductor wafer 200 is allowed to cool below 150° C. and the thin seed layer 224 is deposited to line the adhesion/barrier layer in the second channel opening 106 and the cylindrical via 118. Agglomeration of the copper does not occur below 150° C. Examples of suitable seed materials include copper and copper alloys. The seed layer 224 is deposited using conventional deposition techniques, such as physical vapor deposition, chemical vapor deposition, or a combination thereof.

Next, the second conductive material is deposited into second channel opening 106 and via 118 using conventional metal deposition techniques, such as physical vapor deposition, chemical vapor deposition, electroplating, or a combination thereof. Thereafter, a chemical-mechanical polishing process is used to complete the conventional interconnect process similar to what were shown and described in FIG. 1 and FIG. 2.

Accordingly, by using the high temperature deposition process of the present invention, intermix of the copper/tantalum interface can be performed while avoiding agglomeration of the subsequently deposited copper seed layer. Thus, the problem, associated with the interface between the adhesion/barrier layer of the via and the copper layer in the conductive channel below the via, having difficulty bonding is solved. And the problem, associated with the interface between the adhesion/barrier layer of the via and the copper layer, cue contamination between the two layers is also solved.

While the best mode utilizes copper as the conductive material, it should be understood that the present invention is applicable to other conductive materials such as copper, aluminum, silver, gold, alloys thereof, compounds thereof, and combinations thereof. Similarly, the adhesion/barrier layer can be of tantalum, titanium, tungsten, alloys thereof, compounds thereof (especially nitrides), and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:

providing a semiconductor wafer with a first dielectric layer formed thereon;

forming an opening in said first dielectric layer, said opening defined by walls of said first dielectric layer;

filling said opening with a conductive material;

forming a second dielectric layer on said first dielectric layer;

forming an opening in said second dielectric layer, said opening defined by walls of said second dielectric layer and connected to said conductive material;

forming an adhesion/barrier layer to line said second dielectric layer in said opening and in contact with said conductive material, said forming of said adhesion/barrier layer performed at a high temperature whereby intermixing of said conductive material and said adhesion/barrier layer occurs;

cooling and adhesion/barrier layer to a temperature below a temperature at which seed material agglomerates; and forming a seed layer of said seed material to line said adhesion/barrier layer at a temperature below said agglomeration temperature.

2. The method as claimed in claim 1 wherein the step of heating said semiconductor wafer increases the temperature thereof sufficiently to cause intermixing and insufficiently to cause agglomeration of said conductive material.

3. The method as claimed in claim 1 wherein the step of heating said semiconductor wafer is performed at temperatures at and above 400° C.

4. The method as claimed in claim 1 including the step of cooling said semiconductor wafer to below 150° C. during said step of forming said seed layer.

5. The method as claimed in claim 1 wherein the step of forming said adhesion/barrier layer uses a high temperature deposition technique selected from a group comprising ion metal plasma, collimated physical vapor deposition, other physical vapor deposition, chemical vapor deposition, and a combination thereof.

6. The method as claimed in claim 1 wherein the step forming said adhesion/barrier layer uses a material selected from a group comprising tantalum, titanium, tungsten, alloys thereof, and combinations thereof.

7. The method as claimed in claim 1 wherein the step of forming said seed layer uses a material selected from a group comprising copper, aluminum, silver, gold, alloys thereof, and combinations thereof.

8. The method as claimed in claim 1 wherein the step of filling said opening with a conductive material uses a material selected from a group comprising copper, aluminum, silver, gold, alloys thereof, and combinations thereof.

9. A method of manufacturing a semiconductor device, comprising the steps of:

providing a semiconductor wafer with a first dielectric layer formed thereon;

forming an opening in said first dielectric layer, said opening defined by walls of said first dielectric layer;

filling said opening with a conductive material selected from a group comprising copper, copper alloys, and a combination thereof;

forming a second dielectric layer on said first dielectric layer;

forming an opening in said second dielectric layer, said opening defined by walls of said second dielectric layer and connected to said conductive material;

heating said semiconductor wafer to above the agglomeration temperature of said conductive material;

deposing an adhesion/barrier layer to line said dielectric layer in said opening and in contact with said conductive material during said heating step whereby intermixing of said conductive material and said adhesion/barrier layer occurs, said adhesion/barrier layer selected from a group comprising tantalum, tantalum alloys, and a combination thereof;

cooling said adhesion/barrier layer to a temperature below a temperature at which seed material agglomerates; and depositing a seed layer of said seed material to line said adhesion/barrier layer at a temperature below said agglomeration temperature, said seed layer selected from a group comprising copper, copper alloys, and a combination thereof.

10. The method as claimed in claim 9 wherein the step of heating said semiconductor wafer increases the temperature thereof sufficiently to cause said intermixing and insufficiently to cause difficulty manufacturing other semiconductor devices on said semiconductor wafer.

11. The method as claimed in claim 9 wherein the step of heating said semiconductor wafer increases the temperature thereof sufficiently to cause said intermixing to form an intermixed region about and below 30 angstroms in thickness.

12. The method as claimed in claim 9 wherein the step of heating said semiconductor wafer is performed at temperatures at and above 400° C.

13. The method as claimed in claim 9 including the step of cooling said semiconductor wafer to below 150° C. before said step of depositing said seed layer.

14. The method as claimed in claim 9 wherein the step of heating said semiconductor wafer uses a high temperature deposition technique selected from a group comprising ion metal plasma, collimated physical vapor deposition, other physical vapor deposition, chemical vapor deposition, and a combination thereof.

* * * * *